United States Patent [19]

Ho et al.

[11] 4,090,254
[45] May 16, 1978

[54] CHARGE INJECTOR TRANSISTOR MEMORY

[75] Inventors: Irving Tze Ho; Jacob Riseman, both of Poughkeepsie, N.Y.

[73] Assignee: International Business Machines Corporation, Armonk, N.Y.

[21] Appl. No.: 662,492

[22] Filed: Mar. 1, 1976

[51] Int. Cl.² ................... G11C 11/24; G11C 11/40
[52] U.S. Cl. .................................. 365/150; 365/177; 357/43
[58] Field of Search ................ 340/173 CA, 173 R

[56] References Cited

U.S. PATENT DOCUMENTS

| | | | |
|---|---|---|---|
| 3,390,273 | 6/1968 | Weckler | 240/173 R |
| 3,699,540 | 10/1972 | Lynes et al. | 340/173 R |
| 3,729,719 | 4/1973 | Wiedmann | 340/173 CA |
| 3,827,034 | 7/1974 | Colaco | 340/173 CA |
| 3,949,243 | 4/1976 | Sander et al. | 340/173 R |

*Primary Examiner*—Bernard Konick
*Assistant Examiner*—Donald E. McElheny, Jr.

*Attorney, Agent, or Firm*—Theodore E. Galanthay

[57] ABSTRACT

Disclosed is a dynamic memory cell storing digital information, particularly adapted for integrated semiconductor circuit fabrication. The circuit configuration has a bipolar transistor with information storage preferably in the capacitance of the junctions, and a field effect transistor (FET) for selectively injecting charge into the capacitances. In integrated form, isolation is required only between columns of cells, a buried subcollector forming a common sense line for the entire column, while each of the base regions (also used as a first controlled region of the FET) requires no external contact at all. A further impurity region formed into each column of cells forms a second region of the FET and can be used as a bit line for the entire column. In one embodiment, separate contacts are provided for each of the emitter regions and each of the FET gate regions, while in another embodiment, only a single contact to both of the emitter region and FET gate region of each cell is required.

22 Claims, 10 Drawing Figures

CHARGE INJECTOR TRANSISTOR MEMORY

CROSS REFERENCE TO RELATED APPLICATIONS OR PATENTS

Dennard, U.S. Pat. No. 3,387,286, issued June 4, 1968, and assigned to the assignee of the present invention.

BACKGROUND OF THE INVENTION

1. Field of the Invention

This invention relates to a semiconductor storage cell for use in an electronic memory array and more particularly an improved dynamic storage cell adapted for integrated semiconductor circuit fabrication.

2. Description of the Prior Art

Semiconductor memory arrays incorporating semiconductor storage cells are in common usage for the purpose of storing digital information paricularly in conjunction with electronic data processing equipment. These storage cells have been classified in various ways depending on the particular structural features or mode operation. Thus, there have been developed memory cells having one device, two devices, three devices, four devices, six devices, and perhaps more. By "devices" is usually meant the number of transistors, either bipolar or field effect transistor in a given cell. An example of a one device field effect transistor memory is found in Dennard U.S. Pat. No. 3,387,286. An example of a four device field effect transistor memory is found in De Simone et al. U.S. Pat. No. 3,836,892 and several of the references cited therein. Memories may also be classified in terms of whether they are DC stable (static) or AC stable (dynamic) the latter requiring regeneration.

Desirable aspects of a semiconductor memory array include high speed operation, dense packaging of a large number of cells on a single semiconductor substrate, and low power consumption. Further, each group of memory cells forming a memory array requires support circuits and a minimization of the number of support circuits desired is also an advantageous feature. In the case of a dynamic memory (AC stable) the retention time which determines how frequently the memory must be regenerated is also significant. Traditionally, the fastest memories have been the multi-device bipolar transistor memories with the corresponding disadvantage of occupying the greatest space and consuming the greatest amount of power. A slower memory such as a one device field effect transistor memory can be packaged much more densely and dissipates less heat. Another disadvantage of one device FET memory cells is a relatively low level output signal.

SUMMARY OF THE INVENTION

Accordingly, it is the primary object of this invention to provide an improved memory cell having high density packaging, low power consumption and very fast access time;

It is another object of this invention to provide an improved memory cell with a relatively high level signal output;

It is still another object of this invention to provide a dynamic memory cell with a relatively long retention time;

Lastly, it is an object of this invention to provide a memory cell with a relatively high one to zero ratio, that is, a significant difference between the outputs designating one or zero.

In accordance with the present invention, a semiconductor memory cell which, from a circuits point of view, includes one bipolar transistor and one field effect transistor (FET), is provided. The FET is connected between the bit line and the base region of the bipolar transistor, while the buried subcollector region of the bipolar transistor forms a sense line. Storge preferably takes place in the capacitances of the PN junctions of the bipolar transistor. This memory cell is integrable by known semiconductor processing techniques into a smaller space than normally required for a single bipolar transistor. This packing density advantage is achieved by minimizing the required isolation regions as well as the required contacts and "wiring". Isolation regions, contacts, and wiring, are known to occupy a significant portion of the space in an integrated circuit. In accordance with one embodiment, two wiring contacts are required for each cell while in another embodiment, only one wiring contact is required. A bipolar transistor normally requires three contacts. Accordingly, a memory cell in accordance with the present invention takes less than half the space of a usual bipolar transistor.

In addition to the advantages of dense spacing, the present cell has the merit of self-amplification. Depending upon whether a logical "one" or "zero" is to be written, the bit line will inject or not inject a finite amount of charges into the internal storage capacitances through the FET. Assume for the purposes of this example that a logical "one" is designated as the presence of the charge in the internal storage. Then, in reading a "one", the injected charge goes out through the base emitter junction and a sensing signal of beta times the charge is detected at the collector node. Beta is the common emitter current gain of the transistor. In reading a "zero", no charge is originally stored and thus no charge will be read out through the base emitter junction and no sense signal will be detected.

In addition to the aforementioned features of the present memory cell, there is the further advantage of minimal power consumption. The cell consumes no power in storage as all dynamic cells do. In one of the embodiments, no steady state DC current is ever dissipated. This significantly enhances the power/performance ratio of the cell because the performance which is based on the speed of the bipolar switching transistor, is already very high. It is well known that bipolar transistors have very high switching speeds and the combination of that feature with the low power consumption results in a superior storage cell.

The foregoing and other objects, features, and advantages of this invention will be apparent from the following more detailed description of the embodiments of the invention as illustrated in the accompanying drawings.

DESCRIPTION OF THE INVENTION

Figure 1:
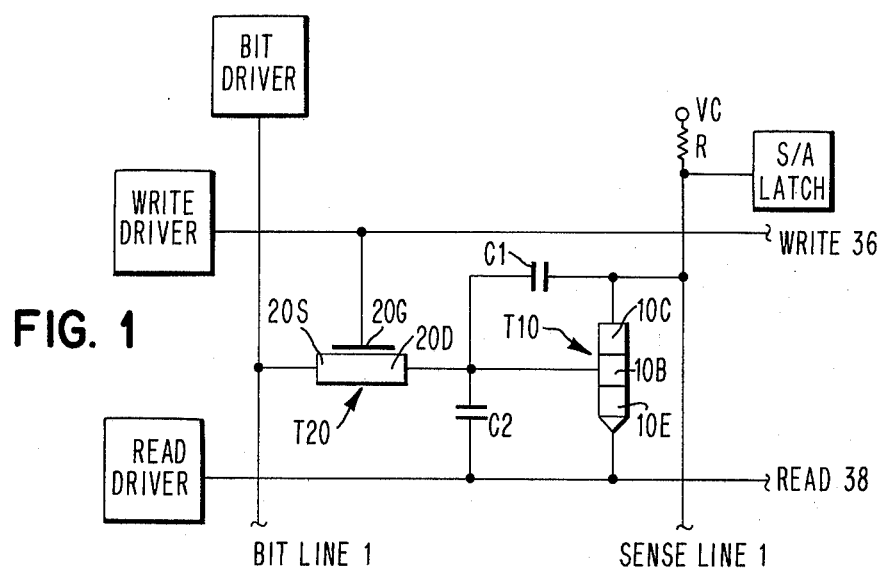
FIG. 1 is a schematic circuit diagram illustrating one embodiment of the present invention.

With general reference to the drawings and particular attention to FIG. 1, it is noted that the present storage cell including means to amplify the output of the storage cell is embodied in transistor T10 having a collector 10C, a base 10B and an emitter 10E. For purposes of illustration, an NPN transistor has been selected, although those skilled in the art will recognize the obvious modification required to interchange a PNP with an NPN transistor. A first capacitance C1 is operatively associated with the base to collector junction of transistor T10. In the preferred form, C1 is the actual base to collector junction capacitance and has been shown as a separate capacitor merely for purposes of illustration. Similarly, the second capacitance C2 operatively associated with the base to emitter junction of transistor T10 is preferably the PN junction capacitance.

In order to alter the charge state of the first and second capacitances, field effect transistor (FET) T20 is provided. As illustrated, T20 is a P channel transistor but if T10 were a PNP bipolar transistor then T20 would preferably be an N channel FET. T20 includes two controlled regions 20S and 20D, also arbitrarily designateable as the source and drain regions. T20 also has a gating electrode 20G for rendering the drain to source path of T20 conductive or non-conductive. In order to bring gating electrode 20G to a desired potential, it is connected to a write driver. In order to alter the state of the charge of the first and second capacitances, it is necessary to turn T20 on by means of the write driver applying a gating signal, the bit driver bringing the bit line to one of two binary states which then determines the charge state of the capacitances. The write driver then adjusts the potential of gate 20G to render T20 nonconductive, thereby trapping the charge.

In order to sense the state of the memory cell, the read driver which is connected to the emitter 10E of transistor T10 is brought to a logical down level. Also note that the sense amp latch is connected to the collector 10C of T10. Assuming that a positive charge was injected into T10, then bringing the read line down forward biases the base to emitter junction of T10, turning it on, and providing an output at the sense amp latch that is a current change related to the stored charge times the beta of T10. Resistor R is the customary load resistor while terminal VC is a positive potential supply in the case when T10 is an NPN transistor.

Figure 2:
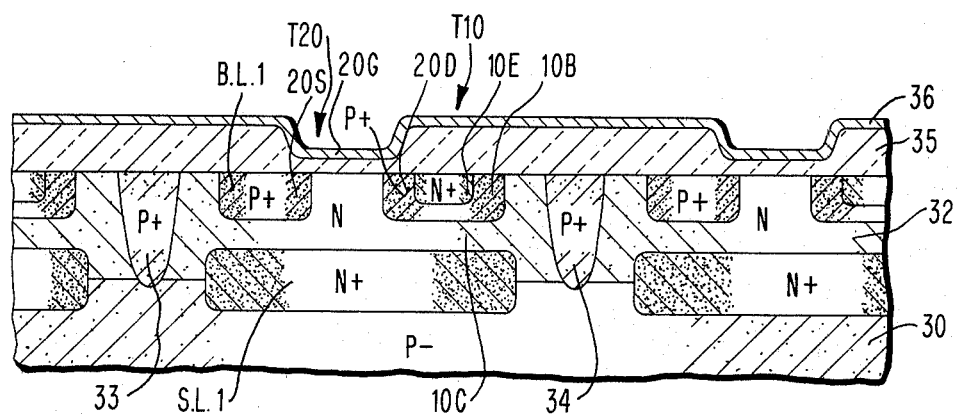
FIG. 2 is a cross sectional view of an integrated semiconductor structure embodying the equivalent circuit of FIG. 1 of the present invention.

Refer now to FIG. 2 for an actual structural embodiment in integrated form. Corresponding semiconductor regions have been correspondingly referenced insofar as practical. The array of memory cells is formed on substrate 30. For purposes of illustration, a lightly doped P type substrate is used as a starting wafer and has N+ type impurities introduced therein, selectively forming a plurality of N+ type regions. Impurities may be introduced by diffusion or ion implantation in accordance with well known semiconductor processing techniques. These N+ regions form the subcollectors of the bipolar transistors and are elongated to form a common sense line (e.g. S.L. 1) as might be better seen by reference to the top view illustrated in FIG. 3.

During the deposition of an epitaxial layer 32, the subcollector outdiffuses into the lightly doped N type epitaxial material as shown. Subsequently, the various additional impurities are introduced selectively by well known processing techniques. The P+ regions 33 and 34 are arranged in parallel to isolate the columns of cells from each other. Although junction isolation is shown, those skilled in the art are aware that dielectric isolation could be similarly used, and might even be preferred. The P+ or P region 10B forms the base of transistor T10 as well as the controlled region 20D of field effect transistor T20. Usually, the region 20S of the transistor T20 is formed at the same time. In the presently illustrated embodiment, the impurity region 20S is elongated and also forms the bit line (e.g. B.L.1) for the memory cell. Those skilled in the art will recognize that a conductive bit line consisting of highly doped polycrystalline silicon, for example, could be used as a bit line physically connected to the noted impurity region. A metallic line could also be used, but would complicate the device fabrication process. Also, it is not necessary for the N+ subcollector to extend under FET T20.

An insulating layer such as silicon dioxide layer 35 covers the top surface of the device. This oxide is intentionally thinned over the N- regions between spaced regions 20S and 20D to form the channel region for FET T20. A subsequent metallic deposition 36 running orthogonally to the bit lines and sense lines then forms the write line and the gate region 20G of transistor T20 in those areas where the oxide was thinned.

Figure 3:
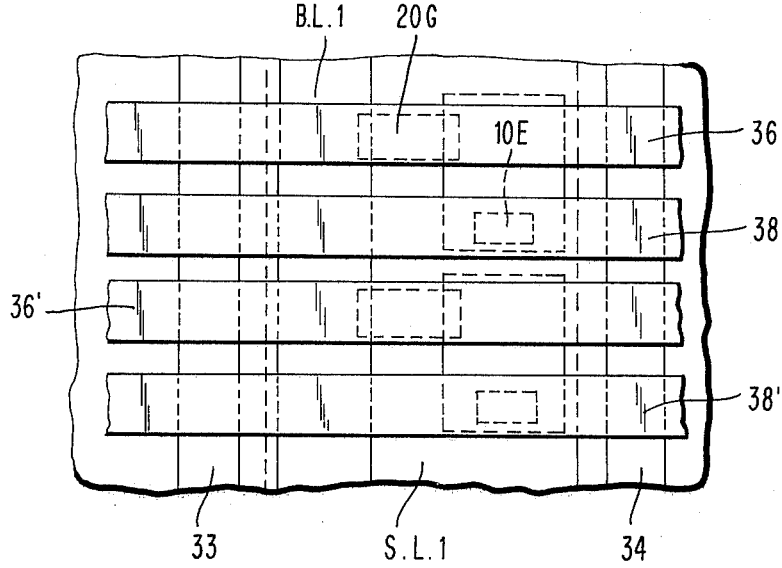
FIG. 3 is a top view of the semiconductor structure of FIG. 2.

As best seen by referring to FIG. 3, a second set of metallic conductors 38, form read line 38 and make electrical contact through a hole in oxide 35 to emitter 10E. Subsequent corresponding pairs of metallic lines have been designated as 36' and 38'.

Figure 5:
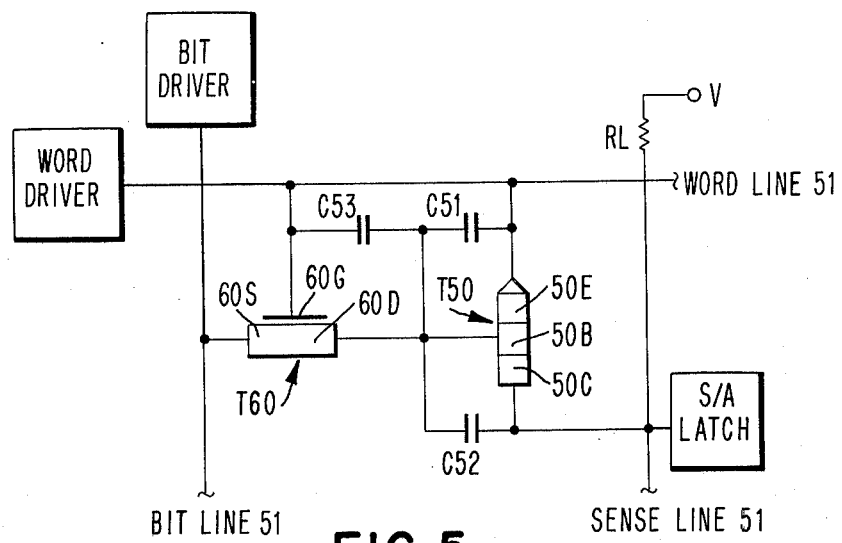
FIG. 5 is a schematic circuit diagram of another embodiment of the present invention.
Figure 6:
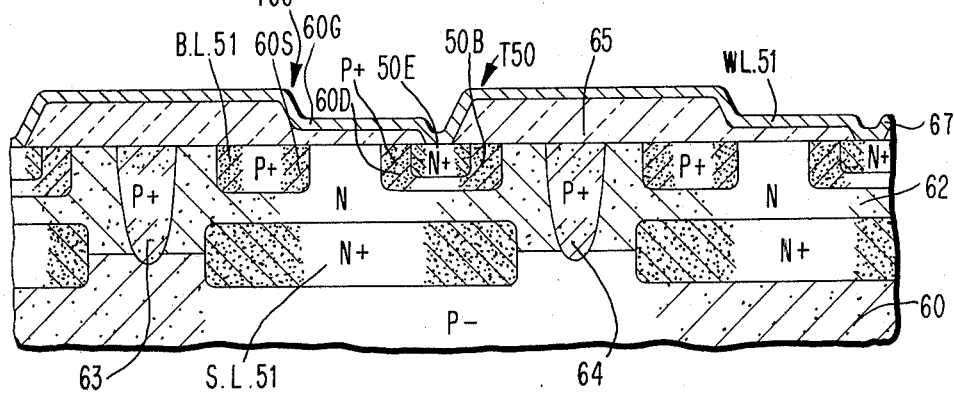
FIG. 6 is a cross sectional view of an integrated semiconductor structure embodying the FIG. 5 schematic circuit drawing of the present invention.
Figure 7:
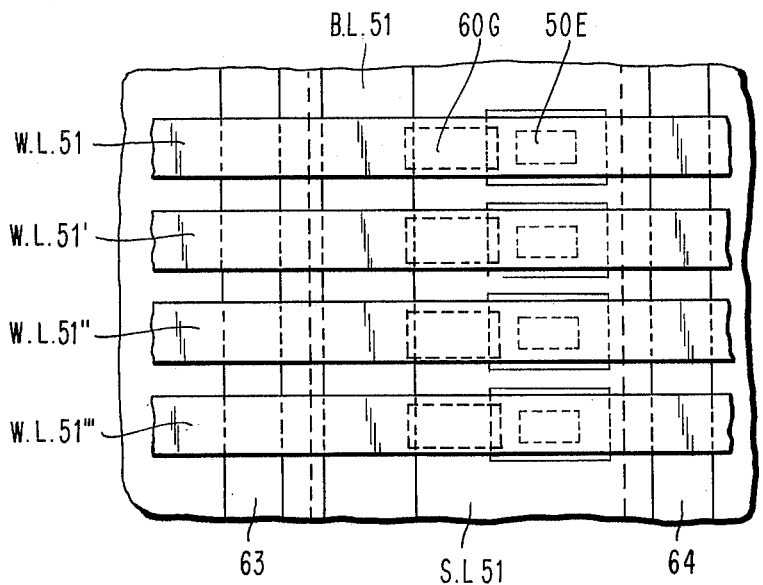
FIG. 7 is a top plan view of the semiconductor structure of FIG. 6.

Refer now to FIG. 5, 6, and 7, for an alternate embodiment of the present invention. The primary distinction is that the bipolar transistor emitter contact and the FET gate contact are joined providing a memory cell with a single metallic contact, thereby doubling the possible packing density of the already densely packaged previously described embodiment. By limiting the cell to a single metallic contact, the previously described write driver and read driver are also merged into a single word line driver, driving word line 51.

As illustrated in FIG. 5, a bipolar transistor T50 having collector region 50C, base region 50B, and emitter region 50E act as the storage and amplification element. An NPN transistor has again been selected for purposes of illustration. The illustrated capacitance C51 is preferrably not a discrete capacitor but rather the capacitance of the base to emitter PN junction. Capacitance C52 is similarly the PN junction formed between the base region 50B and collector region 50C. The capacitance C53 is an inherent capacitance between the region 50B and the gate region 60G as those skilled in the art will readily recognize by referring to the structural arrangement of FIG. 6. Field effect transistor FET T60 is again of the P channel type, complementing the NPN transistor selected for purposes of illustration. FET T60 consists of source region 60S, drain region 60D and gating electrode 60G. Source region 60S is connected to bit line 51 and the bit line driver. The gating electrode is connected to word line 51 and the word driver. The sense line 51 is connected to, and forms part of the subcollector region of, the collector region 50C. The sense amplifier latch receives the output of the cell. Resistor RL is the usual load resistor and is connected to a positive source of fixed potential V.

With continued reference to FIG. 5, also refer to FIG. 6 where corresponding elements have been numbered with similar reference numerals insofar as practical. The array of memory cells is formed on substrate 60. For purposes of illustration, a lightly doped P type substrate is used as a starting wafer and has N+ type impurities introduced therein, selectively forming a plurality of N+ type regions (e.g. S.L. 51). Impurities may be introduced by diffusion or ion implantation in accordance with well known semiconductor processing techniques. These N+ regions from the subcollectors of the bipolar transistors and are elongated to form a common sense line (e.g. S.L. 51) as might be better seen by reference to the top view illustrated in FIG. 7.

During the deposition of an epitaxial layer 62, the subcollector outdiffuses into the lightly doped N type epitaxial material as shown. Subsequently, the various additional impurities are introduced selectively by a well known processing techniques. The P+ regions 63 and 64 are arranged in parallel to isolate the columns of cells from each other. A pair of spaced P+ regions are introduced, usually simultaneously, over the subcollector region. A first one of said pair of P+ or P regions simultaneously forms drain 60D of FET T60 and base 50B of transistor T50. A N+ emitter region 50E is introduced into the base region 50B. As previously explained, information storage takes place in form of charge in the capacitances between the base-emitter and base-collector regions. The second of the pair of P+ regions 60S forms the source region of FET T60. It may also be elongated along with the N+ subcollector region in parallel therewith to form the bit line B. L. 51. As previously explained, it would also be possible to have a more conductive line superimposed over the P+ regions 20S. Such a more conductive line could be highly doped poly silicon or even an additional metal line in the event that multilayer metallization were not objectionable. In the preferred embodiment, however, the region 20S would be elongated to form the bit line thereby permitting access to the cell with a single metal line.

The just described intermediate structure is then covered by a layer of insulating material such as silicon dioxide 65, which is selectively thinned over portions to form the gate regions for FET T60. Also, an opening is provided in oxide 65 for the metallization to reach through to emitter 50E. The metal line 67 then contacts emitter 50E, forms the gate 60G for FET T60, while inherently forming one plate of the illustrated capacitance C53 in the event a thinned oxide is also placed over the region 50B-60D, as shown.

With continued reference to FIG. 6, also refer to FIG. 7 which shows a top view of the structure. A single metallic line 51 acts as the word line to contact a desired row of cells at the gating electrode 60G and emitter contact 50E. Although only a partial column of cells is shown in FIG. 7 for simplifying the illustration, it is understood that a plurality of cells each having a gate 60G and an emitter 50E are placed along a row and connected to word line 51 in an identical manner. Additional word line 51', 51", and 51''' contact additional rows of cells as shown. A complete column of cells is contacted by bit line B.L. 51 which is preferrably the P+ diffusion forming a region 60S of each field effect transistor T60. An entire column is also contacted by a single sense line such as S.L. 51 which is preferrably a buried subcollector region as shown. Each column of cells is isolated from each other by parallel isolation zones 63 and 64.

Figure 9:
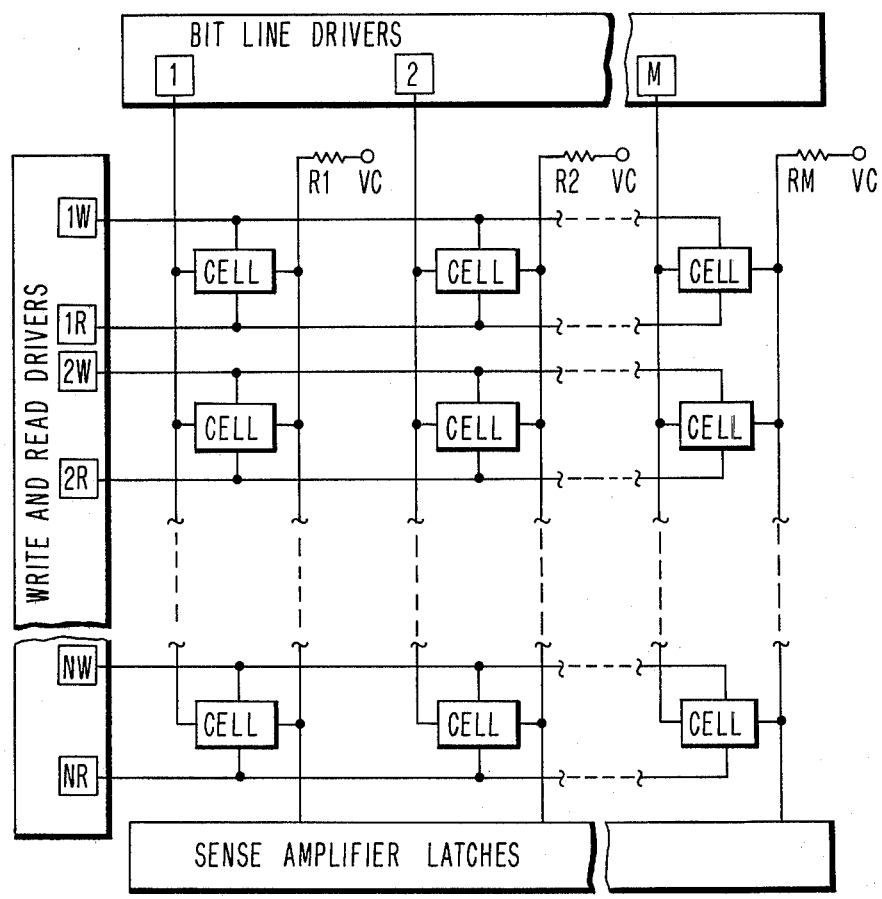
FIG. 9 is an exemplary array of memory cells in accordance with the FIG. 1-3 embodiments.

Refer now to FIG. 9 which illustrates an array of cells wherein each cell has an internal structure in accordance with the FIGS. 1-3 embodiment. Each column of cells 1, 2, through M has one bit line connected to each cell within that column and driven by a bit line driver. The selection of a given bit line is determined by known decoder circuitry, not shown. Every cell in each column is also connected to a single sense line and, via the sense line, to a sense amplifier latch. Each sense amplifier latch has associated with it a corresponding load resistor R1, R2, through RM each connected to a common fixed potential supply VC.

Each row of cells is also contacted by a pair of lines orthogonal to the sense and bit lines. A first of these orthogonal lines is a write line and a second of these orthogonal lines is a read line, each connected to a corresponding write driver and read driver. In this manner, rows 1, 2, through N, are independently selectable. The internal connection of the write and read lines within the cell are shown in greater detail in FIGS. 1-3. In order to read the information from a row of cells, only one of read lines 1R, 2R, through NR needs to be acitivated in order to read out the entire row along the sense lines in each column. If information is desired to be written into the cell, one of write lines 1W, 2W, through NW must be selected in addition to the bit line drivers, 1, 2, through M providing the binary pattern of ones and zeros desired to be stored in that row.

Figure 10:
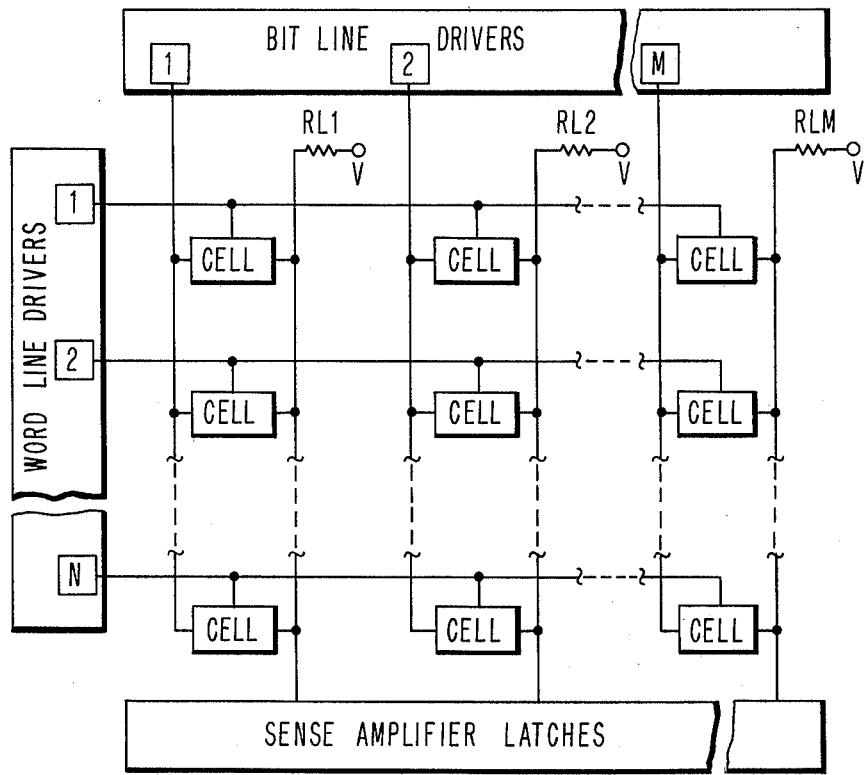
FIG. 10 is an exemplary array of memory cells in accordance with the FIGS. 5-7 embodiment.

Refer now to FIG. 10 which shows an array of memory cells incorporating cells in accordance with the FIGS. 5-7 embodiment. As previously explained, a noteworthy difference as compared with the previous embodiment is the requirement for only a single word line driver which forms the only metallic contact to the cell. The column arrangement is quite similar to the previous embodiment, in which each column of cells is contacted by one bit line, and one sense line. Each bit line is actuated by a bit line driver while each sense line supplies the signal to a sense amplifier latch. The sense lines again have the customary load resistors RL1, RL2, through the RLM each connected to a common fixed potential V. In the case of a NPN transistor storage cell, the potential V is positive. The internal connections to the cells are as illustrated in FIGS. 5-7.

Figure 4:
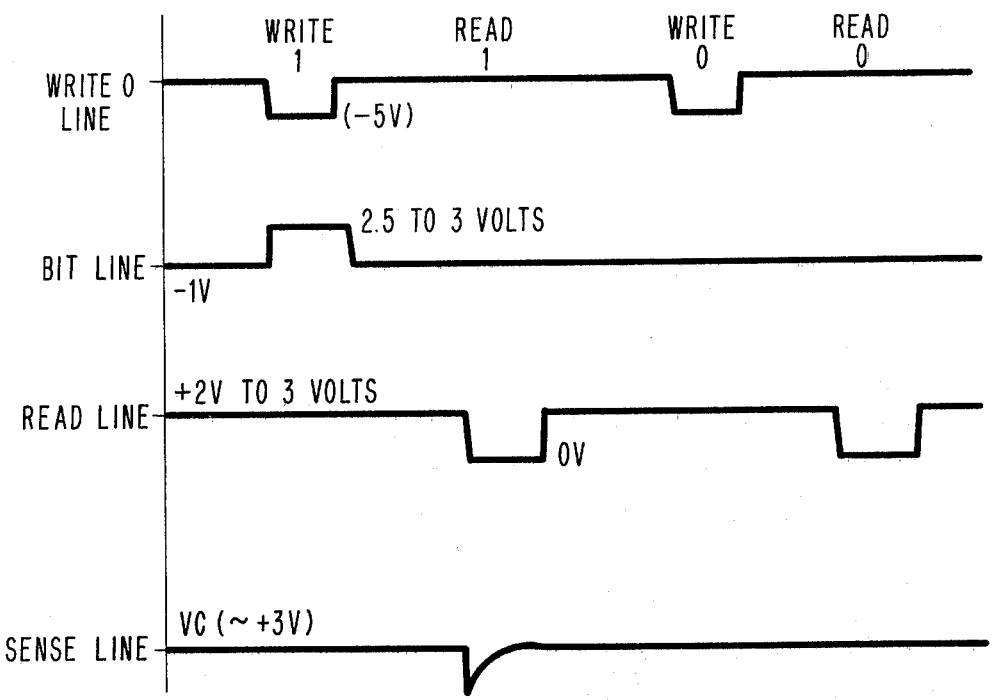
FIG. 4 is a series of wave-form diagrams depicting the operation of the embodiment shown in FIGS. 1-3.

The operation of the present memory cells is characterized by self-amplification, high performance, and low power consumption. The details of operation of the embodiments shown in FIGS. 1-3 and 9 will be better understood with reference to the wave form diagrams of FIG. 4. Assume that the P channel field effect transistor T20 has a threshold voltage of −2 volts on an "on" resistance of approximately 20,000 ohms. Also assume that a binary 1 is designated by a positive charge being injected into the base of T10 while the absence of injected charge indicates a binary zero.

In order to write a "one", the write driver brings the write line 36 to approximately −5 volts with a pulse having a duration in the order of 10 to 20 nanoseconds (NS). Approximately simultaneously, the bit driver brings bit line one from −1 volt to approximately 2.5 to 3 volts. For the highest speed operation, these pulses should be as short as possible while providing adequate time for the storage capacitance to charge fully. To assure that none of the trapped charge is lost, the write line is brought back up to zero volts slightly ahead of the bit line being brought to −1 volts, thereby turning off FET T20 prior to bringing down the potential on the bit line. During the write time, both the read line and the sense line are maintained at an up level causing the charge to be trapped in T10 in the manner previously described.

If it is desired to read information from the cell, the read driver brings the read line (assume read line 38 selected in the present example) from an up level voltage of +2 volts to +3 volts to a down level of zero volts. In the event that a one was stored, the base to emitter junction of transistor T10 becomes forward biased, turning T10 on, thereby pulling the sense line down.

The amplitude of the signal on the sense line is beta times the charge stored, beta being the amplification factor of the transistor normally in the range of 20 to 200. Thus, a very large sense signal is applied to the sense amplifier latch. Such a high output signal from a memory cell is highly desirable particularly in single line sensing where common mode noise cannot be eliminated with a differential sense amplifier. Those skilled in the art will recognize that this manner of reading is destructive reading and information must be written back into the cell after reading. This is performed by conventional techniques known prior to the present invention. As was previously mentioned, the present memory is also a dynamic memory such that after a relatively long period of time (e.g. 10 miliseconds), regeneration is periodically required. Such regeneration is also performed by conventional techniques presently used for dynamic memories. An example of the foregoing conventional techniques can be found in the herein cross referenced Dennard U.S. Pat. No. 3,387,286.

In order to write a zero, only the write line is brought to a down level, thereby turning T20 on. Since the bit line is maintained at a down level, no charge is injected into T10, (or existing charge is drained from T10), thereby bringing the base 10B of transistor T10 to a down level approaching the −1 volt level of the bit line. During the subsequent read operation, when the read line 38 is brought to a down level, the base emitter junction will not be biased on so that T10 will remain off and the sense line will remain at its up level. From the foregoing, it is apparent that the speed of the cell during the read cycle is essentially limited only by the rise time of the down going pulse on the read line. The write time is slightly longer being limited by the time required to turn on T20 and fully charge the storage capacitance.

Figure 8:
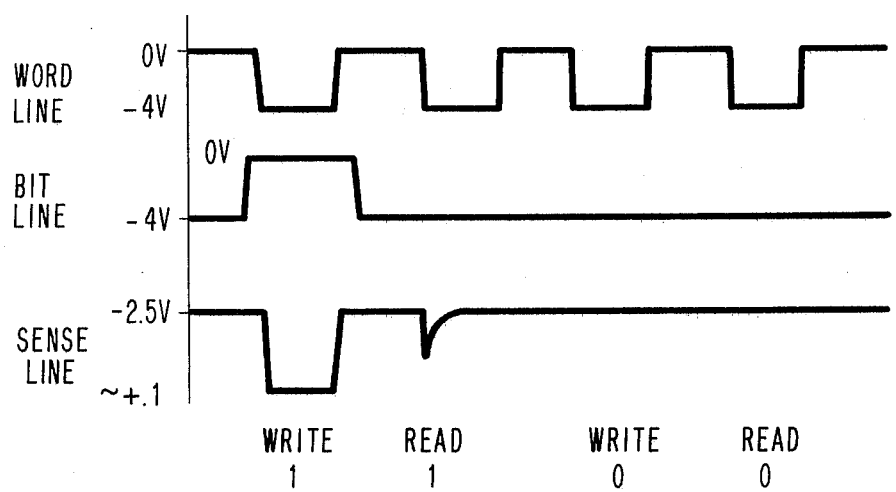
FIG. 8 is a series of wave-form diagrams depicting the operation of the embodiment shown in FIGS. 5-7.

Refer now to the wave forms of FIG. 8 describing the operation of the embodiment depicted in FIGS. 5–7 and 10. In order to write a one into the cell, the word line is brought from 0 to −4 volts while the bit line is raised from −4 volts to 0 volts. This results in T60 being turned on while the bit line is brought to an up level, thereby injecting charge into the base of T50. The word line is brought up, turning T60 off before the bit line is brought back to the down level trapping the desired charge. After FET T60 is turned on tending to inject current into the base of T50, the base emitter junction of T50 will be forward biased permitting the flow of direct current. This causes the sense line to be brought down from 2.5 volts to approximately 0.1 volts. As soon as the word line returns to 0 volts, T50 is cut off, FET T60 is turned off, and the sense line returns to 2.5 volts, thereby trapping the charge in the capacitances. Because of the brief flow of D.C. current, this embodiment uses more power, but provides denser packaging. After writing a "one", the base 50B may be about 1 volt higher than after writing a "zero" by different voltage (IR) drops in the word driver.

In order to read the information from transistor T50, the word line is brought to a down level. In the case of sensing a "one", the base emitter junction of T50 is forward biased turning T50 on. This brings the sense line to a down level indicating the presence of a logical one. It is recognized that in reading a one by bringing the word line to a down level, not only T50 but also FET T60 are turned on. It is noted, however, that the resistance of FET T60 in the on state is (about) three orders of magnitude higher than the impedance of transistor T50 in the on state. The capacitance through the high resistance path is also higher, further increasing the time constant. Thus the bulk of the charge flows through the bipolar transistor producing a read signal comparable in magnitude to the previously described embodiment. Accordingly, the fact that FET T60 is also turned on does not affect the sense output signal.

In order to write a zero into the presently described embodiment, the word line is brought to a down level while the bit line is also maintained at a down level. The down level word line turns FET T60 on thereby causing the base of T50 to remain at a down level. Since T50 remains off, the sense line is unaffected during the writing of a zero. In order to sense a zero, the word line is brought to a down level. This will not forward bias the base to emitter junction of T50 so that T50 remains off. The turning on of T60 while reading a zero essentially has no effect since the bit line and the base of T50 are already essentially at the same potential.

Those skilled in the art will recognize the possibility of two parasitic devices in the present design. The first is a PNPN diode (SCR) and the second is a lateral PNP bipolar device. Both these devices can be prevented from turning on by keeping the collector of NPN transistor at a high voltage. The collector of the bipolar transistor is kept at the supply potential during quiescent time, the positive voltage of the supply potential being the highest voltage in the system. During read time, the collector potential can drop somewhat but not sufficiently to activate the PNPN diode. It is important in the design to maintain the voltage of the sense line such that it always remains the most positive voltage in the cell. Regarding the parasitic lateral PNP bipolar device, the two PN junctions (the source and drain of the FET to the collector region of the bipolar transistor) will usually be reverse biased and never be sufficiently forward biased to turn on, thereby not presenting a problem.

As in any dynamic memory cell, retention time is based on the various leakage phenomena. In the present case, the leakage phenomena include FET leakage, base emitter diode reverse biased leakage, and base collector diode reverse biased leakage. The FET leakage may occur after writing a "one". The charges stored in may leak back to the bit line. When this leakage occurs, it represents a lean "one". To stop such leakage, the gate of the FET should be raised sufficiently to prevent surface inversion. The two reverse biased diode leakages have a tendency to fatten a "zero". In other words, when a "zero" is written, no positive charge is stored. Positive charges will gradually leak into the floating base in the form of saturation currents. All "zeros" will turn to "ones" after a long period of time. Regeneration cycling should take place before the fat "zero" occurs. It has been found that a fat "zero" tends to occur prior to a lean "one", the former being the limiting factor in the retention time of the cell.

Relating to the retention time to the semiconductor structure processes, it is noted that the leakage currents are primarily made up of two parts. One is bulk and the other is surface dependent. The bulk leakage current is theoretically the depletion layer generation-recombination current. This current depends on area and on the minority carrier lifetime. As a larger area can accommodate or tolerate more charge, the retention time should not have any strong dependency on area. On the other hand, retention time has a much stronger dependency on minority carrier lifetime which could be increased by gettering process to remove metallic impurities and some annealing process to reduce crystalline defects. The surface leakage currents include the FET leakage under weak inversion conditions and the surface leakages of reverse biased diodes. As previously described, the FET leakage is controllable by gate voltage and the diode surface leakage is parameter dependent.

What has then been described is an improved transistor memory cell characterized by small size, high speed, low power consumption, relatively long retention time, and large signal differences between the one and zero binary states. A whole column of memory cells share the same subcollector diffusion (sense line) and the P+ diffusion (bit line). In one embodiment, only one metallic contact per cell is needed. The "base region" in each embodiment is not connected to the outside world. Only one layer of metallurgy is required. The cell is much smaller than a single bipolar transistor because of no base contact, no collector contact, and no isolation within a column.

While the invention has been shown and particularly described with reference to preferred embodiments, it will be understood by those skilled in the art that various changes in form and detail may be made therein without departing from the spirit and scope of the invention.

What is claimed is:

1. A semiconductor transistor memory cell comprising:
   a bipolar transistor having emitter, collector, and base regions, with base to emitter and base to collector PN junctions;
   a first capacitance operatively associated with said base to collector PN junction;
   a second capacitance operatively associated with said base to emitter PN junction;
   means including a field effect transistor having two controlled regions defining drain and source regions, a drain to source path between said controlled regions and a gating electrode for controlling the conductive state of said drain to source path, for altering the charge state of said first and second capacitance for binary information storage in said first and second capacitances; and
   sensing means for sensing the stored binary information;
   said gating electrode and emitter region being electrically connected to each other.

2. A semiconductor transistor memory cell as in claim 1 in which said sensing means is electrically connected to the collector region.

3. A semiconductor transistor memory cell as in claim 1 wherein said first and second capacitances are the inherent junction capacitances of the transistor.

4. A semiconductor transistor memory cell as in claim 1 wherein said sensing means includes means connected to the emitter region of said transistor for biasing the base to emitter junction of said transistor into a conductive state when it is desired to sense the charge state of said transistor, thereby providing an amplified sense signal at the collector of said transistor.

5. A semiconductor transistor memory cell as in claim 1 further comprising:
   a third capacitance operatively associated with said base region and said gating electrode.

6. A semiconductor transistor memory cell as in claim 1 in which one of said controlled regions and said base region are formed in a common region of semiconductor material.

7. A semiconductor transistor memory cell comprising:
   a bipolar transistor having emitter, collector, and base regions, with base to emitter and base to collector PN junctions;
   a first capacitance operatively associated with said base to collector PN junction;
   a second capacitance operatively associated with said base to emitter PN junction;
   means including a field effect transistor having two controlled regions defining drain and source regions, a drain to source path between said controlled regions and a gating electrode for controlling the conductive state of said drain to source path, for altering the charge state of said first and second capacitances for binary information storage in said first and second capacitances;
   one of said controlled regions and said base region being formed in a common region of semiconductor material;
   the other one of said controlled regions forming a bit line for said semiconductor transistor memory cell; and
   sensing means for sensing the stored binary information.

8. A semiconductor transistor memory cell as in claim 7 wherein said collector forms a sense line for said semiconductor transistor memory cell.

9. A semiconductor transistor memory cell as in claim 8 in which said bipolar transistor is a NPN transistor and said field effect transistor is of the P channel type.

10. A semiconductor transistor memory cell as in claim 9 wherein the gating electrode of said field effect transistor is connected to a write line for rendering the drain to source path of said field effect transistor conductive only when it is desired to insert information into said cell.

11. A semiconductor transistor memory array comprising:
   a plurality of bit lines arranged in parallel, one each associated with a column of memory cells;
   a plurality of sense lines arranged in parallel, one each associated with one of said column of cells;
   a plurality of accessing lines arranged in parallel to each other and orthogonally to said bit and sense lines, at least one accessing line being connected to a row of cells;

each said cell comprising a semiconductor transistor memory cell in accordance with claim 7.

12. A semiconductor transistor memory array as in claim 11 in which each said row of cells is connected to at least two accessing lines.

13. A semiconductor memory array as in claim 12 wherein a first one of said of at least two accessing lines is a write line while the other of said at least two accessing lines is a read line.

14. A semiconductor transistor memory cell as in claim 7 formed on a body, said body comprising:
   a semiconductor substrate doped with impurities of a first conductivity type;
   a subcollector region of an opposite conductivity type buried within said body;
   a pair of regions of said first conductivity type formed within said body over said subcollector region;
   an emitter region of said opposite conductivity type formed in a first one of said pair of regions of first conductivity type; and
   a relatively thin layer of insulating material formed over at least a portion of an area between said pair of regions of first conductivity type covered with a conductive material.

15. A structure as in claim 14 in which a plurality of said cells are arranged in columns, further comprising:
   isolation zones for isolating each of said columns of cells from each other;
   said buried subcollector region being elongated as a common subcollector to all said cells in a column.

16. A structure as in claim 15 wherein the second of said pair of regions of said first conductivity type is elongated in parallel to said buried subcollector forming a common bit line for said plurality of cells in said column.

17. A structure as in claim 14 wherein:
   said pair of regions of said first conductivity type form drain and source regions for a field effect transistor;
   said conductivity material forming a gate region for said field effect transistor.

18. A structure as in claim 17, wherein said first one of said pair of regions forms a base region.

19. A structure as in claim 18 wherein said conductive material forming a gate region is extended at least partially over said base region.

20. A structure as in claim 17, in which said conductive material forming said gate region is also formed into electrical contact with said emitter region.

21. A structure as in claim 20 in which a plurality of said cells are arranged in columns, further comprising:
   isolation zones for isolating each of said columns of cells from each other;
   said buried subcollector being elongated as a common subcollector to all said cells in a column.

22. A structure as in claim 21 wherein the second of said regions of said first conductivity type is elongated in parallel to said buried subcollector forming a common bit line for said plurality of cells in said column.

* * * * *